(12) United States Patent
Tsujimoto

(10) Patent No.: US 12,566,195 B2
(45) Date of Patent: Mar. 3, 2026

(54) CURRENT SENSOR

(71) Applicant: Asahi Kasei Microdevices Corporation, Tokyo (JP)

(72) Inventor: Masaki Tsujimoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 142 days.

(21) Appl. No.: 18/644,082

(22) Filed: Apr. 23, 2024

(65) Prior Publication Data

US 2024/0272206 A1      Aug. 15, 2024

Related U.S. Application Data

(63) Continuation of application No. 18/449,698, filed on Aug. 14, 2023, now Pat. No. 11,971,432.

(30) Foreign Application Priority Data

Oct. 4, 2022      (JP) ................................. 2022-160191

(51) Int. Cl.
    *G01R 15/20*      (2006.01)
    *G01R 19/00*      (2006.01)
(52) U.S. Cl.
    CPC ....... *G01R 15/207* (2013.01); *G01R 19/0092* (2013.01)
(58) Field of Classification Search
    CPC ... G01R 15/207; G01R 19/0092; H01L 23/66; H01L 23/49575
    See application file for complete search history.

(56) References Cited

U.S. PATENT DOCUMENTS

| | | | |
|---|---|---|---|
| 9,529,013 B2 | 12/2016 | Racz | |
| 2013/0020660 A1* | 1/2013 | Milano | ................ G01R 15/207 257/E27.005 |
| 2014/0167736 A1 | 6/2014 | Suzuki | |
| 2016/0187388 A1 | 6/2016 | Suzuki | |

(Continued)

FOREIGN PATENT DOCUMENTS

| | | |
|---|---|---|
| JP | 2012229950 A | 11/2012 |
| JP | 2015152363 A | 8/2015 |

(Continued)

OTHER PUBLICATIONS

Those references were submitted as IDS or found by the examiner over the earlier U.S. Appl. No. 18/449,698, filed Aug. 14, 2023.

*Primary Examiner* — Dominic E Hawkins

(57) ABSTRACT

A current sensor is configured such that at least one magnetoelectric conversion element, a conductor, a signal processing IC, an IC supporting portion, and an element supporting portion are encapsulated with an encapsulating portion. The current sensor is comprised of a pair of first lead terminals that is partially exposed outside the encapsulating portion, is electrically connected to the conductor, inputs a measurement current to the conductor, and outputs the measurement current from the conductor; and a metal member that is partially exposed outside the encapsulating portion and is spaced apart from the conductor. The element supporting portion further supports the metal member on a surface on the same side as a first surface on which the IC supporting portion supports the signal processing IC.

6 Claims, 5 Drawing Sheets

(56)  References Cited

U.S. PATENT DOCUMENTS

2016/0223594 A1 *   8/2016   Suzuki ................... G01R 15/20
2017/0160313 A1     6/2017   Koiwa
2018/0156845 A1 *   6/2018   Suzuki ................ G01R 15/202
2020/0132728 A1     4/2020   Boury
2020/0357987 A1     11/2020  Li

FOREIGN PATENT DOCUMENTS

JP        6017182  B2   10/2016
JP     2018116047  A     7/2018
WO     2015033541  A1    3/2015

* cited by examiner

10

10

CURRENT SENSOR

CROSS-REFERENCE TO RELATED APPLICATIONS

This application is a continuation of U.S. patent application Ser. No. 18/449,698, filed on Aug. 14, 2023, the entire contents of which are explicitly incorporated herein by reference. The application also claims priority from the following Japanese patent application, the entire contents of which are also explicitly incorporated herein by reference:
    No. 2022-160191 filed in JP on Oct. 4, 2022.

BACKGROUND

1. Technical Field

The present invention relates to a current sensor.

2. Related Art

Patent Document 1 and Patent Document 2 disclose a current sensor having a magnetoelectric conversion element.

PRIOR ART DOCUMENT

Patent Document

Patent Document 1: Japanese Patent No. 6415148
Patent Document 2: Japanese Patent No. 6017182

DESCRIPTION OF EXEMPLARY EMBODIMENTS

Figure 1A:
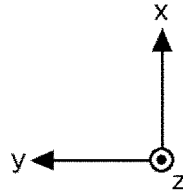
FIG. 1A is a schematic plan view seen from the top side of a current sensor according to a first embodiment.

Hereinafter, embodiments of the present invention will be described, but the embodiments do not limit the invention according to the claims. In addition, not all of the combinations of features described in the embodiments are essential to the solution of the invention.

The current sensor includes a primary conductor through which a measurement current to be measured flows, a magnetoelectric conversion element that detects a magnetic field generated by the measurement current; and a signal processing IC that amplifies a signal of the magnetoelectric conversion element and outputs it to the outside, and the primary conductor, the magnetoelectric conversion element, and the signal processing IC are encapsulated by a resin to provide one semiconductor package.

For example, Patent Document 1 discloses a current sensor including a primary conductor with a U-shape, a magnetoelectric conversion element arranged at an opening of the primary conductor, and a signal processing IC. An insulating member supporting the magnetoelectric conversion element is arranged such that it is in contact with a bottom surface of a supporting portion that supports the signal processing IC without being contact with the primary conductor.

In addition, similarly to Patent Document 1, Patent Document 2 discloses a current sensor including a primary conductor with a U-shape, a magnetoelectric conversion element arranged at an opening of the primary conductor, and a signal processing IC. An insulating member supporting the magnetoelectric conversion element is arranged such that it is in contact with a back surface of the primary conductor.

In the current sensor described in Patent Document 2, the insulating member supporting the magnetoelectric conversion element is adhered to the primary conductor. Therefore, when conductive impurities exist between the insulating member and an encapsulating portion, a defect may occur in the magnetoelectric conversion element due to a high voltage applied to the primary conductor.

In the current sensor described in Patent Document 1, the supporting portion supports the signal processing IC, and the insulating member supports the supporting portion and the magnetoelectric conversion element. Since the insulating member stably supports the magnetoelectric conversion element surrounded by the primary conductor, the supporting portion necessarily has a shape of surrounding the primary conductor. On the other hand, since a large current flows through the primary conductor, heat is generated most in the package. The heat generated in the primary conductor is transferred to the insulating member and the supporting portion, and further transferred to the signal processing IC. Therefore, in the current sensor described in Patent Document 1, a possibility of occurrence of a defect is not high as compared with the current sensor described in Patent Document 2, but the temperature of the signal processing IC becomes high, and when current is applied for a long period of time, a defect may occur.

In this regard, in a first embodiment and a second embodiment, a current sensor is provided which is capable of further reducing the possibility of occurrence of a defect even when the measurement current to be measured is large and effectively allowing the measurement current to flow for a longer period of time.

Figure 1B:
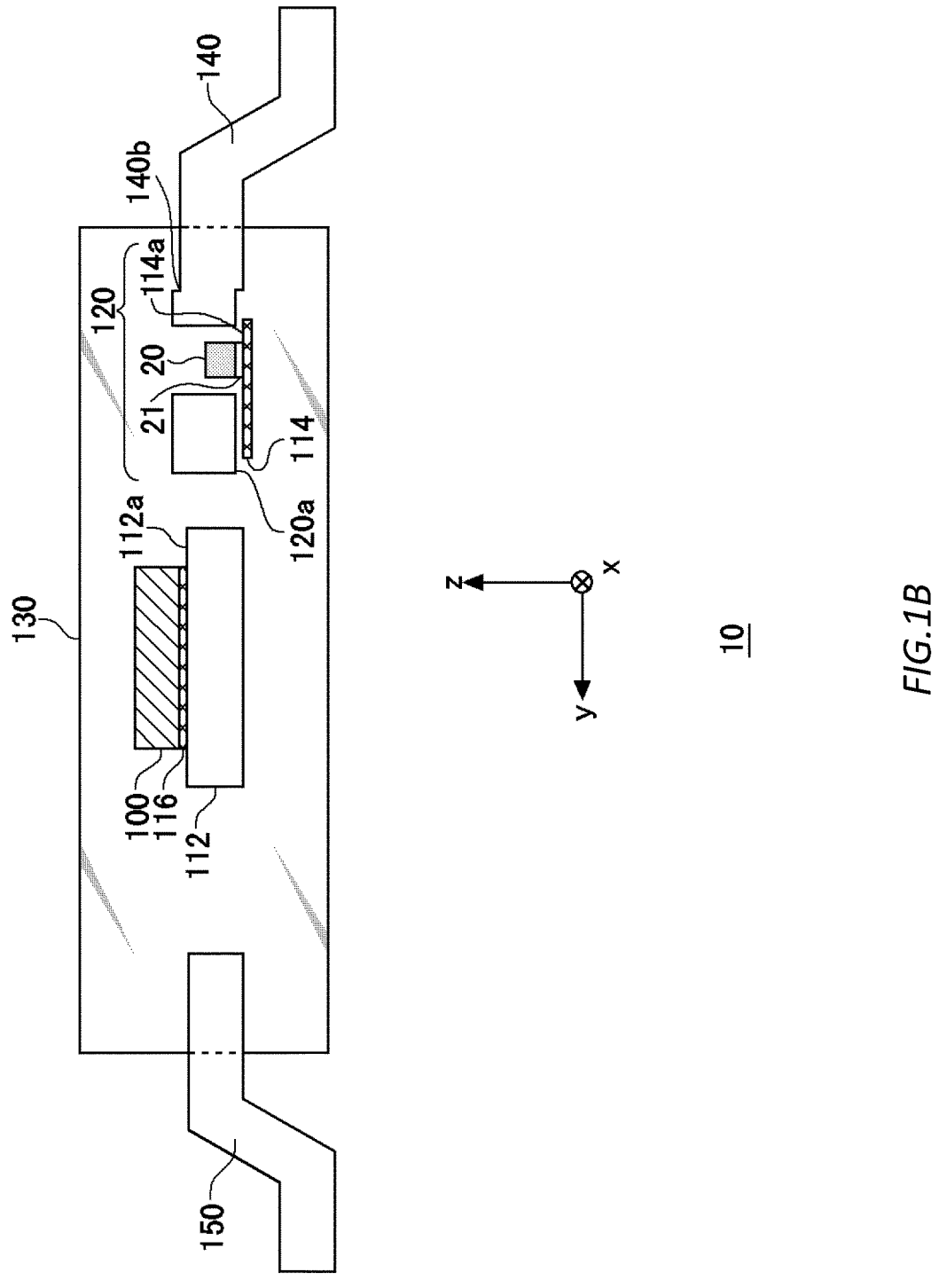
FIG. 1B is an A-A line sectional view of the current sensor shown in FIG. 1A.

FIG. 1A and FIG. 1B show the internal configuration of a semiconductor package that serves as a current sensor 10 according to a first embodiment. FIG. 1A is a schematic plan view seen from the top side (in the Z axis direction) of the current sensor 10 according to the first embodiment. FIG. 1B is an A-A line sectional view of the current sensor 10 shown in FIG. 1A.

For the coordinate, in FIG. 1A, the X axis direction is defined as a direction from bottom to top and parallel to the document, the Y axis direction is defined as a direction from right to left and parallel to the document, and the Z axis direction is defined as a direction from back to front and perpendicular to the document. Any one axis among the X axis, the Y axis, and the Z axis is orthogonal to another axis.

The current sensor 10 includes a signal processing IC 100, a magnetoelectric conversion element 20, an IC supporting portion 112, an element supporting portion 114, a conductor 120, an encapsulating portion 130, a pair of lead terminals 140, a plurality of lead terminals 150, and suspending pins 160. The magnetoelectric conversion element 20 is electrically connected to the signal processing IC 100 via wires 30. The signal processing IC 100 is electrically connected to the plurality of lead terminals 150 via wires 108.

The encapsulating portion 130 encapsulates the magnetoelectric conversion element 20, the conductor 120, the signal processing IC 100, the IC supporting portion 112, the element supporting portion 114, the wires 30, and the wires 108 by a resin. The resin may be, for example, an epoxy-based thermosetting resin to which silica is added.

The magnetoelectric conversion element 20 detects a magnetic field in a particular direction that changes in response to a measurement current flowing through the conductor 120, and then the signal processing IC 100 amplifies a signal that depends on an intensity of the magnetic field and outputs an amplified signal via the lead terminal 150. The magnetoelectric conversion element 20 may be a chip that is comprised of a compound semiconductor formed on a GaAs substrate and is cut into a square shape or a rectangular shape in the plan view in the Z axis direction. The magnetoelectric conversion element 20 may have a substrate comprised of silicon or compound semiconductor and a magnetoelectric conversion portion provided on the substrate. The thickness of the substrate is adjusted by grinding a surface on the negative side in the Z axis direction. The substrate may have a desired thickness in the range from 50 μm to 600 μm. Because the magnetic field in the Z axis direction is to be detected, a Hall element is appropriate as the depicted magnetoelectric conversion element. In addition, if the magnetoelectric conversion element 20 is arranged at a position for detecting a magnetic field in a direction of any one axis on the XY plane, for example, if it is arranged at a position for detecting a magnetic field in the X axis direction, a magneto-resistance element or a flux gate element is appropriate as the magnetoelectric conversion element.

Figure 1C:
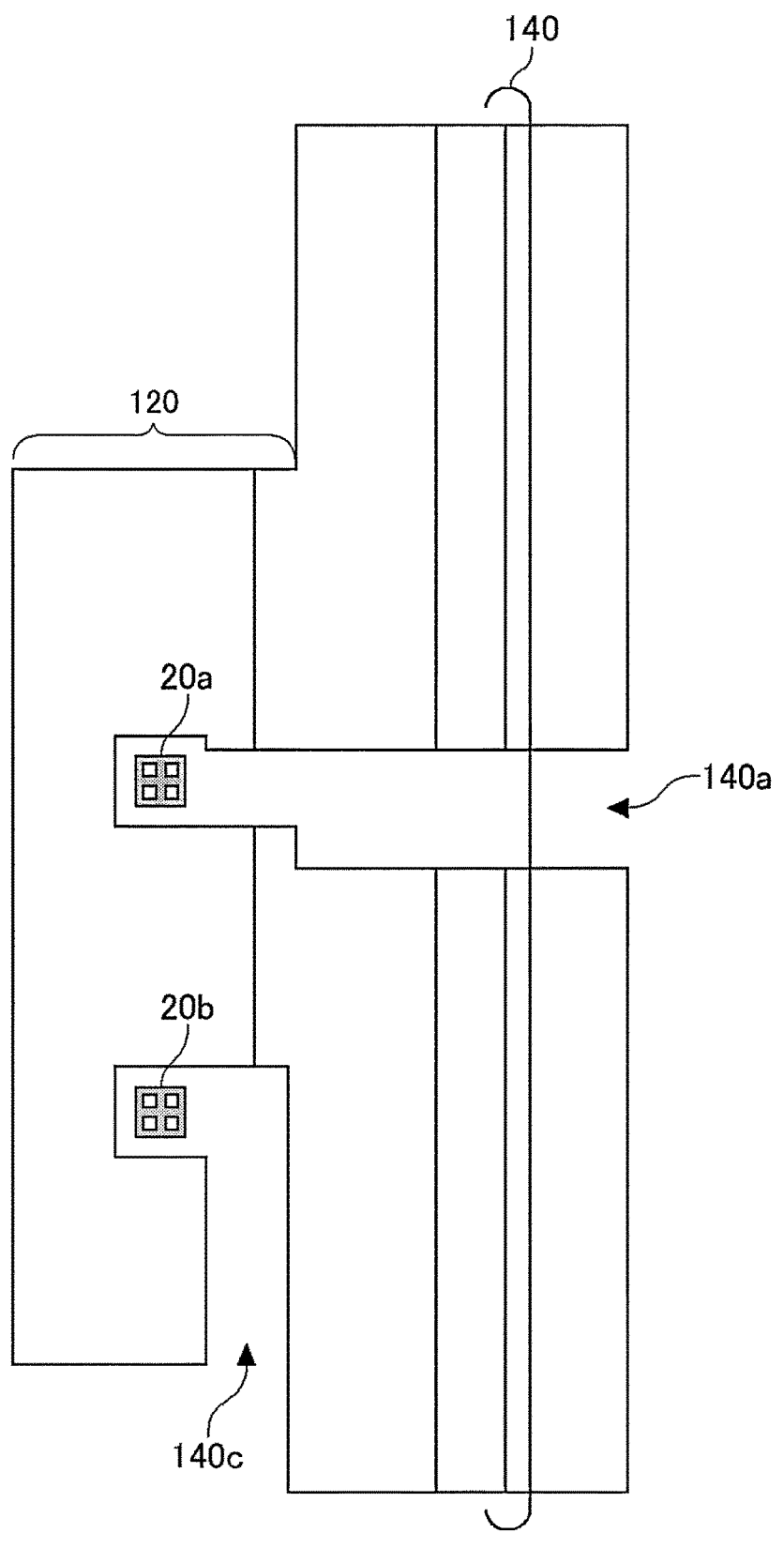
FIG. 1C is a schematic plan view seen from the top side around a conductor of the current sensor according to a variation of the first embodiment.

In the first embodiment, an example is described where the current sensor 10 includes one magnetoelectric conversion element 20. However, the current sensor 10 may include two or more magnetoelectric conversion elements 20. In a plan view, at least a part of each of the plurality of magnetoelectric conversion elements 20 may be surrounded by the conductor 120. A part of the conductor 120 may be arranged between each of the plurality of magnetoelectric conversion elements 20. When the current sensor 10 includes two magnetoelectric conversion elements 20a and 20b, for example, as shown in FIG. 1C, the conductor 120 has a slit 140a opened to a side surface 130a side and a slit 140c opened to a side surface 130d side. The magnetoelectric conversion element 20a may be arranged in the slit 140a, and the magnetoelectric conversion element 20b may be arranged in the slit 140c.

The signal processing IC 100 processes a signal output from the magnetoelectric conversion element 20. The signal processing IC 100 is a large scale integration (LSI). The signal processing IC 100 is cut into a rectangular shape or a square shape in the plan view. The signal processing IC 100 is electrically connected to the magnetoelectric conversion element 20 via the wires 30. Furthermore, the signal processing IC 100 is electrically connected to the plurality of lead terminals 150 via the wires 108. The wires 30 and the wires 108 may be formed of a conductor material, main components of which are Au, Ag, Cu, or Al. The signal processing IC 100 is a signal processing circuit comprised of a Si monolithic semiconductor formed on a Si substrate. It may be a compound semiconductor substrate instead of the Si substrate. The signal processing circuit processes an output signal that depends on an intensity of a magnetic field output from the magnetoelectric conversion element 20. The signal processing circuit outputs, via the lead terminal 150, a signal indicating a current value of a measurement current flowing through the conductor 120 based on the output signal. The signal processing IC 100 is cut into a rectangular shape or a square shape in the plan view. The thickness of the substrate of the signal processing IC 100 is adjusted by grinding a surface on the negative side of the Z axis direction. The substrate has a desired thickness in the range from 50 μm to 600 μm. The signal processing circuit of the signal processing IC 100 includes a circuit that inputs a small output signal depending on the intensity of the magnetic field from the magnetoelectric conversion element and at least amplifies the input signal.

The conductor 120 has a U-shape in the plan view, surrounds at least partially the magnetoelectric conversion element 20 in the plan view, and flows a measurement current to be measured by the magnetoelectric conversion element 20. The conductor 120 is electrically connected to the pair of lead terminals 140. The conductor 120 may be configured to be physically integrated with the pair of lead terminals 140. The measurement current is input to one of the pair of lead terminals 140 and is output from the other of the lead terminals 140 via the conductor 120. The pair of lead terminals 140 and the conductor 120 may be configured to be integrated with each other through a lead frame of a conductor material, a main component of which is copper having a thermal conductivity of 100 W/mK to 450 W/mK at 25° C. The measurement current to be measured by the magnetoelectric conversion element 20 flows through the pair of lead terminals 140 and the conductor 120. The conductor 120 has a slit 140a that makes an opening on the side of a side surface 130a of the encapsulating portion 130. The magnetoelectric conversion element 20 is arranged within the slit 140a. The measurement current flowing through the conductor 120 flows from one end of the U-shape to the other end. This generates, around the conductor 120, a magnetic field that depends on an intensity of the measurement current and a distance from the conductor 120. At a position where the magnetoelectric conversion element 20 is arranged, the magnetic field is generated where the Z axis direction component is highest. Because the magnetoelectric conversion element 20 is arranged within the slit 140a, a high sensitivity can be achieved for the measurement current.

The pair of lead terminals 140 and the plurality of lead terminals 150 are arranged such that they oppose to each other via the signal processing IC 100 in the direction (the Y axis direction) that intersects with the thickness direction (the Z axis direction) of the signal processing IC 100. The pair of lead terminals 140 is partially exposed on the side surface 130a of the encapsulating portion 130. The plurality of lead terminals 150 is partially exposed on a side surface 130b that is opposite to the side surface 130a of the encapsulating portion 130. The suspending pins 160 are partially exposed on a side surface 130c and a side surface 130d that oppose to each other in the X axis direction and are different from the side surface 130a and the side surface 130b of the encapsulating portion 130. The suspending pins 160 are metal members to support a semiconductor package on a lead frame in the manufacturing phase. The suspending pins 160 are leads to support the encapsulating portion 130 that is formed by a mold resin during an assembly process.

The plurality of lead terminals 150 is a metal member in which at least two lead terminals 150 of the plurality of lead terminals 150 are electrically connected to the signal processing IC 100, and the suspending pins 160 are metal members not electrically connected to output a signal from the signal processing IC 100 to the outside. The suspending pins 160 are separate from the plurality of second lead terminals. Together with the pair of lead terminals 140 and the conductor 120, the plurality of lead terminals 150 and the suspending pins 160 may be comprised of a lead frame of a conductor material, a main component of which is copper having a thermal conductivity exceeding 100 W/mK. The plurality of lead terminals 150 and the suspending pins 160 are separate from the conductor 120 and are electrically insulated from the conductor 120.

Two suspending pins 160 extend from the side surface 130*c* and the side surface 130*d* of the encapsulating portion 130 toward the conductor 120 to the positions facing the conductor 120. The suspending pins 160 are spaced apart from the conductor 120 and are electrically insulated from the conductor 120. The conductor 120 is arranged between the two suspending pins 160. The conductor 120 may be arranged to be surrounded by the two suspending pins 160. The two suspending pins 160 are examples of the first metal member and the second metal member.

The exposed portions of the two suspending pins 160 are not necessarily positioned at the centers of the side surface 130*c* and the side surface 130*d* of the encapsulating portion 130. The position may be designed to be an optimum position in view of space constraints, a creepage distance between the lead terminal 140 and the magnetoelectric conversion element 20, or the like in addition to the dissipation of the heat generated in the conductor 120.

The pair of lead terminals 140, the conductor 120, the plurality of lead terminals 150, and the suspending pins 160 may be configured to be integrated with each other through a lead frame of a conductor material, a main component of which is copper having a thermal conductivity of 100 W/mK to 450 W/mK at 25° C. The pair of lead terminals 140 is a lead terminal on the primary side, and is an example of the pair of first lead terminals. The plurality of lead terminals 150 is a lead terminal on the secondary side, and is an example of the plurality of second lead terminals. The lead frame has a desired thickness in the range from 50 μm to 600 μm.

The IC supporting portion 112 is a plate-shaped member and supports the signal processing IC 100 on a surface 112*a* on the top side of the current sensor 10. The IC supporting portion 112 may be configured to be integrated with at least one lead terminal among the plurality of lead terminals 150. In the first embodiment, the IC supporting portion 112 is configured to be integrated with a lead terminal 150*a* and a lead terminal 150*b* positioned on both ends in the X axis direction among the plurality of lead terminals 150. The IC supporting portion 112 may be comprised of a lead frame including the plurality of lead terminals 150. The signal processing IC 100 may be adhered to the surface 112*a* of the IC supporting portion 112 via an adhesive layer 116. The adhesive layer 116 may be an adhesive tape. The adhesive tape may be a tape comprised of an epoxy-based resin, and may be a die bonding tape having a general adhesive layer or a die bonding tape also serving as a dicing tape having an adhesive layer.

The IC supporting portion 112 is located only on the signal processing IC side from the end portion of the conductor 120 on the signal processing IC 100 side in the Y axis direction in the plan view. That is, the IC supporting portion 112 is not arranged so as to surround the conductor 120. Therefore, the inflow of heat from the IC supporting portion 112 to the signal processing IC 100 is small. Furthermore, resin can be easily embedded between the IC supporting portion 112 and the conductor 120.

The element supporting portion 114 supports the magnetoelectric conversion element 20 on a surface 114*a* on the same side as the surface 112*a* of the IC supporting portion 112. The element supporting portion 114 is spaced apart from the IC supporting portion 112 and the conductor 120. The conductor 120 has a stepped portion 140*b* such that the surface 114*a* of the element supporting portion 114 and a surface 120*a* of the conductor 120 are spaced apart in the thickness direction (the Z axis direction) of the element supporting portion 114. The conductor 120 has the stepped portion 140*b* such that the portion of the conductor 120 facing the element supporting portion 114 protrudes toward the top side (the positive side of the Z axis direction) of the encapsulating portion 130. The stepped portion 140*b* may be provided on the conductor 120 by a half blanking process so that the element supporting portion 114 and the conductor 120 do not contact with each other. The stepped portion 140*b* may be provided on the conductor 120 by a coining process. The element supporting portion 114 is electrically insulated from the IC supporting portion 112 and the conductor 120. The element supporting portion 114 further supports, on the surface 114*a*, two suspending pins 160 extending from the side surface 130*c* and the side surface 130*d* of the encapsulating portion 130 toward the conductor 120, respectively. The element supporting portion 114 may be comprised of an insulating member. As a result, a creepage distance between the magnetoelectric conversion element 20 and the conductor 120 can be increased. The element supporting portion 114 may be a polymer tape such as a polyimide tape.

The magnetoelectric conversion element 20 may be adhered to the element supporting portion 114 via an adhesive layer 21. The adhesive layer 21 may be an adhesive tape. The adhesive tape may be a tape comprised of an epoxy-based resin, and may be a die bonding tape having a general adhesive layer or a die bonding tape also serving as a dicing tape having an adhesive layer.

The width of the portion of the suspending pin 160 that supports the element supporting portion 114 may be 0.4 mm or more. The width of the adhering region, in which the suspending pin 160 and the element supporting portion 114 are adhered to each other, in the Y axis direction may be 0.4 mm or more.

In addition, a distance k1 between the conductor 120 and each of the two suspending pins 160 in the plan view may be 0.5 times the thickness of the two suspending pins 160 or more.

According to the current sensor 10 according to the first embodiment, the current sensor has an insulation property equivalent to that of the current sensor described in Patent Document 1, and it is not necessary to provide a configuration in which the IC supporting portion 112 surrounds the conductor 120 to be at a high temperature, and thus, it is possible to suppress an increase in the temperature of the signal processing IC 100. In addition, the heat generated in the conductor 120 is transferred to the suspending pin 160 physically spaced apart from the IC supporting portion 112, and is released to the outside of the encapsulating portion 130. Therefore, the signal processing IC 100 can be hardly affected by the heat generated in the conductor 120.

The suspending pin 160 may not be arranged between the IC supporting portion 112 and the side surfaces 130*c* and 130*d* of the encapsulating portion 130, but may be arranged between the conductor 120 and the side surfaces 130*c* and 130*d* of the encapsulating portion 130. As a result, heat does not flow from the suspending pin 160 into the signal processing IC 100, and can be efficiently dissipated to the outside of the encapsulating portion 130. Therefore, the signal processing IC 100 can be more hardly affected by the heat generated in the conductor 120.

When at least a part of the suspending pin 160 is present between the IC supporting portion 112 and the side surfaces 130c and 130d of the encapsulating portion 130, a width k2 of the suspending pin 160 may be 10% or more of a distance k3 between the IC supporting portion 112 and the side surfaces 130c and 130d of the encapsulating portion 130. As a result, heat can be efficiently dissipated to the outside of the encapsulating portion 130 through the suspending pin 160. Therefore, the signal processing IC 100 can be more hardly affected by the heat generated in the conductor 120.

When the adhering region where the element supporting portion 114 and the suspending pin 160 are adhered to each other is excessively small, the element supporting portion 114 is easily deformed, the position of the magnetoelectric conversion element 20 is shifted due to bending or twisting, and variation in sensitivity among individuals increases. In addition, when the adhering region is excessively small, the element supporting portion 114 and the suspending pin 160 are peeled off easily in a manufacturing process, and the position of the magnetoelectric conversion element 20 may fluctuate or the posture of the magnetoelectric conversion element 20 may tilt. As a result, there is a concern that stress is likely to be applied to the wires 30 that electrically connect the magnetoelectric conversion element 20 and the signal processing IC 100. Furthermore, it is conceivable to use, as the element supporting portion 114, a polymer tape such as a polyimide tape, but it is generally difficult to perform processing with an excessively narrow width. Therefore, in consideration of the feasibility of processing, at least one side of the adhering region is preferably 0.4 mm or more. That is, the width of the element supporting portion 114 in the Y axis direction is preferably 0.4 mm or more. However, one side of the adhering region is preferably 10 mm or less so as not to protrude from the encapsulating portion 130.

In addition, from the viewpoint of improving the heat dissipation and suppressing deformation of the element supporting portion 114 as described above, it is desirable that the suspending pin 160 be as close to the conductor 120 as possible in the plan view. However, it is difficult to perform a process of creating the conductor 120 and the suspending pin 160 with one lead frame such that a distance between the conductor 120 and the suspending pin 160 in the plan view is smaller than 0.5 times the thickness of the lead frame (the conductor 120 and the suspending pin 160). Therefore, the distance between the conductor 120 and the suspending pin 160 in the plan view is preferably designed to be 0.5 times or more and 5 times or less the thickness of the lead frame.

Figure 2A:
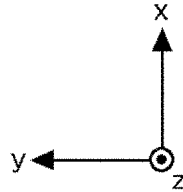
FIG. 2A is a schematic plan view seen from the top side of the current sensor according to a second embodiment.
Figure 2B:
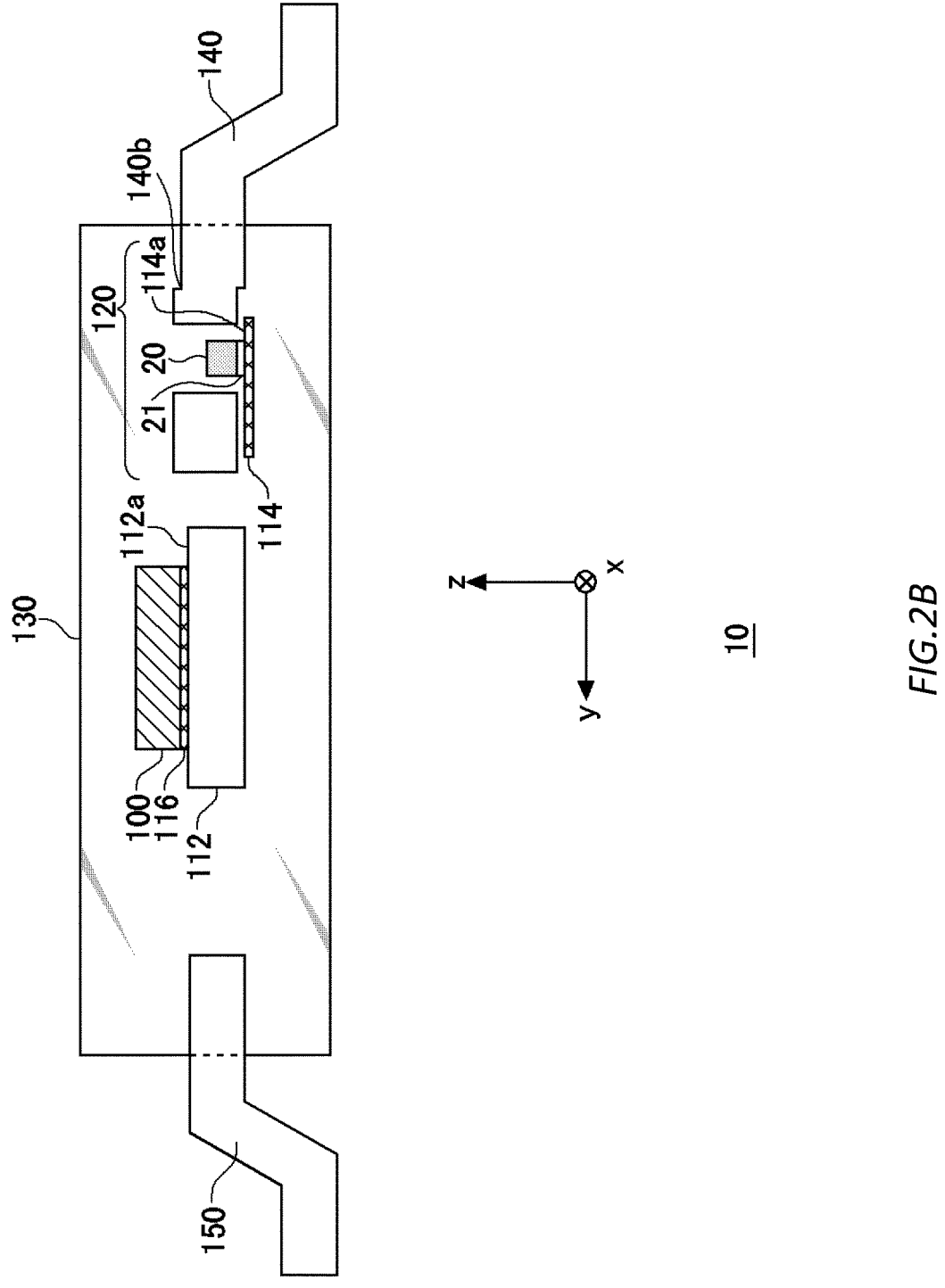
FIG. 2B is an A-A line sectional view of the current sensor shown in FIG. 2A.

FIG. 2A and FIG. 2B show the internal configuration of the semiconductor package that serves as the current sensor 10 according to a second embodiment. FIG. 2A is a schematic plan view seen from the top side (in the Z axis direction) of the current sensor 10 according to the second embodiment. FIG. 2B is an A-A line sectional view of the current sensor 10 shown in FIG. 2A.

The current sensor 10 according to the second embodiment is different from the current sensor 10 according to the first embodiment in that the metal member on which element supporting portion 114 is supported is not the suspending pin 160 but the lead terminal 150 on the secondary side.

The element supporting portion 114 is supported by, for example, the lead terminal 150a and the lead terminal 150b, which are positioned at both ends in the X axis direction, among the plurality of lead terminals 150. Among the plurality of lead terminals 150, a lead terminal 150c and a lead terminal 150d positioned respectively adjacent to the lead terminal 150a and the lead terminal 150b on the inner side of the lead terminal 150a and the lead terminal 150b are configured to be integrated with the IC supporting portion 112.

The conductor 120 and the IC supporting portion 112 are arranged between the lead terminal 150a and the lead terminal 150b.

It is difficult to perform a process of creating the conductor 120 and the lead terminal 150 with one lead frame such that a distance between the conductor 120 and each of the lead terminal 150a and the lead terminal 150b in the plan view is smaller than 0.5 times the thickness of the lead frame (the conductor 120 and the lead terminal 150). Therefore, the distance k1 between the conductor 120 and each of the lead terminal 150a and the lead terminal 150b in the plan view is preferably designed to be 0.5 times or more and 5 times or less the thickness of the lead terminal 150a and the lead terminal 150b.

The width k2 of the lead terminal 150a and the lead terminal 150b may be 10% or more of the distance k3 between the IC supporting portion 112 and the side surfaces 130c and 130d of the encapsulating portion 130. As a result, heat can be efficiently dissipated to the outside of the encapsulating portion 130 through the lead terminal 150a and the lead terminal 150b. Therefore, the signal processing IC 100 can be more hardly affected by the heat generated in the conductor 120.

In the case of the lead terminal 150 other than the lead terminal 150a and the lead terminal 150b supporting the element supporting portion 114, the IC supporting portion 112 may be configured to be integrated with at least one other lead terminal 150. The lead terminal 150a and the lead terminal 150b on which the element supporting portion 114 is supported overlap the IC supporting portion 112 when seen from the surface of which the suspending pin 160 is exposed from the encapsulating portion 130. Furthermore, the IC supporting portion 112 exists only on the second lead terminal side from the conductor 120, and the encapsulating portion 130 is provided between the IC supporting portion 112 and the conductor 120. The encapsulating portion 130 between the IC supporting portion 112 and the conductor 120 overlaps the lead terminals 150a and 150b when seen from the surface on the suspending pin 160 side.

According to the current sensor 10 according to the second embodiment, the current sensor has an insulation property equivalent to that of the current sensor described in Patent Document 1, and it is not necessary to provide a configuration in which the IC supporting portion 112 surrounds the conductor 120 to be at a high temperature, and thus, it is possible to suppress an increase in the temperature of the signal processing IC 100. In addition, the heat generated in the conductor 120 is transferred to the lead terminal 150a and the lead terminal 150b physically spaced apart from the IC supporting portion 112, and is released to the outside of the encapsulating portion 130. Therefore, the signal processing IC 100 can be hardly affected by the heat generated in the conductor 120. In addition, in general, the encapsulation resin absorbs moisture in the air and expands, thereby applying stress to the internal material including the signal processing IC 100. Since the lead terminal 150a and the lead terminal 150b overlap the IC supporting portion 112 when seen from the surface of which the suspending pin 160 is exposed from the encapsulating portion 130, an anchor effect acts on the encapsulation resin, and deformation of the encapsulation resin can be suppressed. Therefore, the stress according to the signal processing IC 100 can be reduced.

Furthermore, since the encapsulating portion 130 between the IC supporting portion 112 and the conductor 120 overlaps the lead terminals 150*a* and 150*b* when seen from the surface on the suspending pin 160 side, cracks of the encapsulating portion 130 due to external force or thermal stress can be suppressed.

When the adhering region where the element supporting portion 114 and each of the lead terminal 150*a* and the lead terminal 150*b* are adhered to each other is excessively small, the element supporting portion 114 is easily deformed, the position of the magnetoelectric conversion element 20 is shifted due to bending or twisting, and variation in sensitivity among individuals increases. In addition, when the adhering region is excessively small, there is a high possibility that the element supporting portion 114 and each of the lead terminal 150*a* and the lead terminal 150*b* are peeled off in the manufacturing process. Furthermore, it is conceivable to use, as the element supporting portion 114, a polymer tape such as a polyimide tape, but it is generally difficult to perform processing with an excessively narrow width. Therefore, in consideration of the feasibility of processing, at least one side of the adhering region is preferably 0.4 mm or more. That is, the width of the element supporting portion 114 in the Y axis direction is preferably 0.4 mm or more. However, one side of the adhering region is preferably 10 mm or less so as not to protrude from the encapsulating portion 130.

While the present invention has been described by way of the embodiments, the technical scope of the present invention is not limited to the above-described embodiments. It is apparent to persons skilled in the art that various alterations or improvements can be made to the above-described embodiments. It is also apparent from the description of the claims that the embodiments to which such alterations or improvements are made can be included in the technical scope of the present invention.

The operations, procedures, steps, stages, etc. of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

[Item 1] A current sensor including:
at least one magnetoelectric conversion element;
a conductor that at least partially surrounds the at least one magnetoelectric conversion element in a plan view, and through which a measurement current to be measured by the at least one magnetoelectric conversion element flows;
   a signal processing IC that processes a signal that is output from the at least one magnetoelectric conversion element;
   an IC supporting portion that supports the signal processing IC on a first surface;
   an insulating element supporting portion that supports the at least one magnetoelectric conversion element on a surface on the same side as the first surface and is spaced apart from the IC supporting portion and the conductor;
   an encapsulating portion that encapsulates the at least one magnetoelectric conversion element, the conductor, the signal processing IC, the IC supporting portion, and the element supporting portion;

a pair of first lead terminals that is partially exposed outside the encapsulating portion, is electrically connected to the conductor, inputs the measurement current to the conductor, and outputs the measurement current from the conductor; and
   a metal member that is partially exposed outside the encapsulating portion and is spaced apart from the conductor and the IC supporting portion, wherein
   the element supporting portion further supports the metal member on a surface on a same side as the first surface.

[Item 2] The current sensor according to item 1, further including:
   a plurality of second lead terminals that is exposed from a surface opposite to a surface of the encapsulating portion from which the pair of first lead terminals is exposed, wherein
   the metal member is separate from the plurality of second lead terminals, and is exposed from a surface different from each of the surface of the encapsulating portion from which the pair of first lead terminals is exposed and the surface of the encapsulating portion from which the plurality of second lead terminals is exposed.

[Item 3] The current sensor according to item 2, wherein the IC supporting portion is configured to be integrated with at least one lead terminal of the plurality of second lead terminals.

[Item 4] The current sensor according to item 2, wherein at least one second lead terminal of the plurality of second lead terminals is electrically connected to the signal processing IC, and the metal member is not electrically connected to the signal processing IC.

[Item 5] The current sensor according to item 4, wherein
   the metal member includes a first metal member and a second metal member, and
   at least a part of the conductor is arranged between the first metal member and the second metal member.

[Item 6] The current sensor according to item 1, further including:
   a plurality of second lead terminals which is exposed from a surface opposite to a surface of the encapsulating portion from which the pair of first lead terminals is exposed, wherein
   the IC supporting portion is configured to be integrated with at least one second lead terminal of the plurality of second lead terminals,
   at least a part of the metal member is a second lead terminal different from the at least one second lead terminal of the plurality of second lead terminals.

[Item 7] The current sensor according to item 6, wherein at least a part of the plurality of second lead terminals is electrically connected to the signal processing IC.

[Item 8] The current sensor according to item 6, wherein
   the metal member includes a first metal member and a second metal member which are two second lead terminals different from the at least one second lead terminal of the plurality of second lead terminals, and
   the conductor and the IC supporting portion are arranged between the first metal member and the second metal member.

[Item 9] The current sensor according to any one of items 1, 2, and 6, wherein the conductor has a stepped portion such that the first surface of the element supporting portion and a surface of the conductor facing the first surface are spaced apart from each other in a thickness direction of the element supporting portion.

[Item 10] The current sensor according to any one of items 1, 2, and 6, wherein the element supporting portion is a polymer tape.

[Item 11] The current sensor according to item 2 or 6, wherein the pair of first lead terminals and the plurality of second lead terminals are arranged to be opposed via the signal processing IC in a first direction intersecting a thickness direction of the signal processing IC, and the IC supporting portion is located only on the signal processing IC side from an end portion of the conductor on the signal processing IC side in the first direction in a plan view.

[Item 12] The current sensor according to any one of items 1, 2, and 6, wherein a width of a portion of the metal member supporting the element supporting portion is 0.4 mm or more.

[Item 13] The current sensor according to item 5 or 8, wherein a distance between the conductor and each of the first metal member and the second metal member in a plan view is 0.5 times the thickness of the first metal member and the second metal member or more.

EXPLANATION OF REFERENCES

10: current sensor
20, 20a, 20b: magnetoelectric conversion element;
21, 116: adhesive layer;
30, 108: wire;
100: signal processing IC
112: IC supporting portion
114: element supporting portion
120: conductor
130: encapsulating portion
140, 150: lead terminal; and
160: suspending pin.

What is claimed is:

1. A current sensor comprising:
at least one magnetoelectric conversion element;
a conductor which at least partially surrounds the at least one magnetoelectric conversion element in a plan view and through which a measurement current to be measured by the at least one magnetoelectric conversion element flows;
a signal processing IC which processes a signal output from the at least one magnetoelectric conversion element;
an IC supporting portion which supports the signal processing IC on a first surface;
an insulating element supporting portion which supports the at least one magnetoelectric conversion element on a surface on a same side as the first surface and is spaced apart from the IC supporting portion and the conductor;
an encapsulating portion which encapsulates the at least one magnetoelectric conversion element, the conductor, the signal processing IC, the IC supporting portion, and the insulating element supporting portion;

a pair of first lead terminals which is partially exposed from a first side surface of the encapsulating portion and electrically connected to the conductor and which inputs the measurement current to the conductor and outputs the measurement current from the conductor;

a suspending pin which is (i) partially exposed from the first side surface of the encapsulating portion, (ii) spaced apart from the conductor and the IC supporting portion, and (iii) electrically insulated from the conductor and the IC supporting portion; and a plurality of second lead terminals which is exposed from a second side surface opposite to the first side surface of the encapsulating portion from which the pair of first lead terminals is exposed, wherein the insulating element supporting portion further supports the suspending pin on the surface on the same side as the first surface, the IC supporting portion is configured to be integrated with at least one second lead terminal of the plurality of second lead terminals, at least a part of the suspending pin is a second lead terminal different from the at least one second lead terminal of the plurality of second lead terminals, at least a part of the plurality of second lead terminals is electrically connected to the signal processing IC, the suspending pin includes a first suspending pin and a second suspending pin which are two second lead terminals different from the at least one second lead terminal of the plurality of second lead terminals, and the conductor and the IC supporting portion are arranged between the first suspending pin and the second suspending pin.

2. The current sensor according to claim 1, wherein the conductor has a stepped portion such that the first surface of the insulating element supporting portion and a surface of the conductor facing the first surface are spaced apart from each other in a thickness direction of the insulating element supporting portion.

3. The current sensor according to claim 1, wherein the insulating element supporting portion is a polymer tape.

4. The current sensor according to claim 1, wherein the pair of first lead terminals and the plurality of second lead terminals are arranged to be opposed via the signal processing IC in a first direction intersecting a thickness direction of the signal processing IC, and the IC supporting portion is located only on the signal processing IC side from an end portion of the conductor on the signal processing IC side in the first direction in a plan view.

5. The current sensor according to claim 1, wherein a width of a portion of the suspending pin supporting the insulating element supporting portion is 0.4 mm or more.

6. The current sensor according to claim 1, wherein a distance between the conductor and each of the first suspending pin and the second suspending pin in a plan view is 0.5 times a thickness of the first suspending pin and the second suspending pin or more.

\* \* \* \* \*